(12) United States Patent
Dodd et al.

(10) Patent No.: US 11,203,195 B2
(45) Date of Patent: Dec. 21, 2021

(54) INFLATABLE PNEUMATIC STENCIL CLAMP

(71) Applicant: ASM Assembly Systems Singapore Pte. Ltd., Singapore (SG)

(72) Inventors: Chris Dodd, Weymouth (GB);
Wenxiong Yang, Guangdong (CN);
Richard Cockram, Broadstone (GB)

(73) Assignee: ASM ASSEMBLY SYSTEMS SINGAPORE PTE. LTD., Singapore (SG)

( * ) Notice: Subject to any disclaimer, the term of this patent is extended or adjusted under 35 U.S.C. 154(b) by 309 days.

(21) Appl. No.: 16/154,915

(22) Filed: Oct. 9, 2018

(65) Prior Publication Data

US 2019/0111674 A1  Apr. 18, 2019

(30) Foreign Application Priority Data

Oct. 13, 2017  (GB) .................................. 1716831.1

(51) Int. Cl.
| | |
|---|---|
| *B41F 15/22* | (2006.01) |
| *B41F 15/36* | (2006.01) |
| *B41F 15/08* | (2006.01) |
| *B25B 11/00* | (2006.01) |
| *H05K 3/12* | (2006.01) |

(52) U.S. Cl.
CPC .............. *B41F 15/22* (2013.01); *B25B 11/00* (2013.01); *B41F 15/0818* (2013.01); *B41F 15/0881* (2013.01); *B41F 15/36* (2013.01); *H05K 3/1225* (2013.01)

(58) Field of Classification Search
CPC .. B41F 15/22; B41F 15/0818; B41F 15/0881; B41F 15/36; B25B 11/00; H05K 3/1225
See application file for complete search history.

(56) References Cited

U.S. PATENT DOCUMENTS

| | | | | |
|---|---|---|---|---|
| 4,967,655 | A * | 11/1990 | Holderegger | ........... B41F 15/34 |
| | | | | 101/128.1 |
| 5,189,950 | A | 3/1993 | Eppinger | |
| 5,732,629 | A * | 3/1998 | Puschnerat | ......... B41F 27/1262 |
| | | | | 101/415.1 |
| 6,001,112 | A * | 12/1999 | Taylor | ............ A61B 17/320758 |
| | | | | 606/159 |
| 6,397,750 | B1 * | 6/2002 | Motoe | ..................... B41L 31/00 |
| | | | | 101/116 |
| 8,459,302 | B2 | 6/2013 | Pederson | |
| 9,162,437 | B2 | 10/2015 | Willshere | |
| 2003/0164100 | A1 * | 9/2003 | Thomas | .................. B41C 1/148 |
| | | | | 101/128.4 |
| 2005/0252395 | A1 * | 11/2005 | Sakaue | ................ H05K 3/1216 |
| | | | | 101/123 |

(Continued)

FOREIGN PATENT DOCUMENTS

| | | |
|---|---|---|
| DE | 2920874 A1 | 12/1980 |
| JP | H02-248207 A | 10/1990 |

(Continued)

*Primary Examiner* — David H Banh
(74) *Attorney, Agent, or Firm* — Ostrolenk Faber LLP

(57) ABSTRACT

A clamping system for clamping a printing screen frame within a printing machine that uses at least one inflatable bladder to effect clamping. The system may be modular, so that bladders and/or extending inserts may be exchanged, replaced or incorporated as required.

14 Claims, 12 Drawing Sheets

(56) References Cited

U.S. PATENT DOCUMENTS

| | | | | |
|---|---|---|---|---|
| 2007/0068213 A1* | 3/2007 | Schmid | ............... | B41F 27/1287 |
| | | | | 72/319 |
| 2008/0078297 A1* | 4/2008 | Seto | ........................ | B41F 15/36 |
| | | | | 101/123 |
| 2008/0216681 A1* | 9/2008 | Shaw | ...................... | B41F 15/36 |
| | | | | 101/128.1 |
| 2010/0300312 A1* | 12/2010 | Niswonger | ............ | B44D 3/185 |
| | | | | 101/127.1 |
| 2012/0102881 A1* | 5/2012 | Moore | ................... | B65B 11/025 |
| | | | | 53/399 |
| 2014/0047990 A1* | 2/2014 | Fujii | ................... | B41F 15/0881 |
| | | | | 101/123 |
| 2017/0080738 A1* | 3/2017 | Bailey | .................... | B41N 1/241 |

FOREIGN PATENT DOCUMENTS

| | | | |
|---|---|---|---|
| JP | 2001-194981 A | 7/2001 | |
| JP | 2005-153443 A | 6/2005 | |
| JP | 2007-185823 A | 7/2007 | |
| JP | 2013-537291 A | 9/2013 | |

* cited by examiner

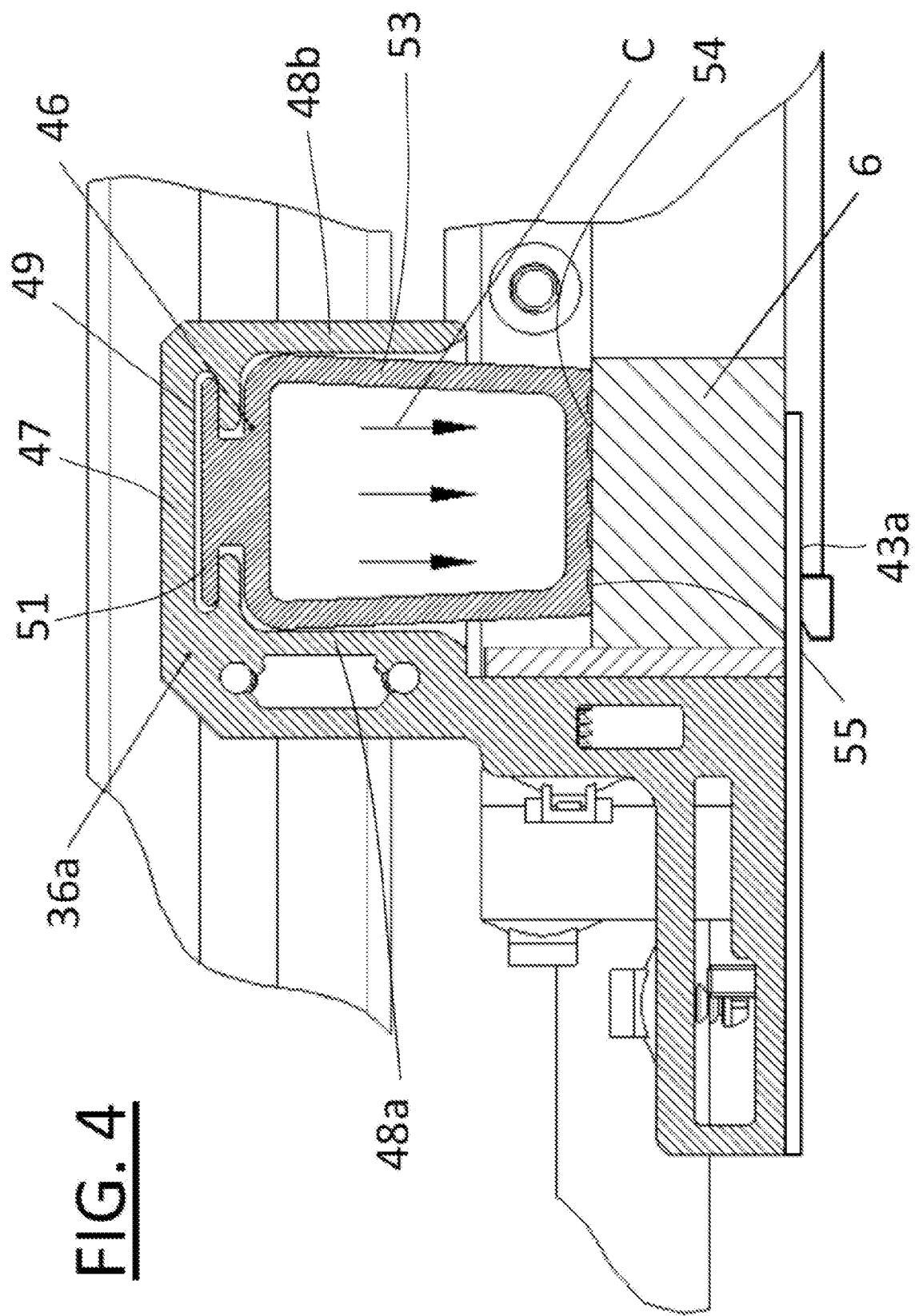

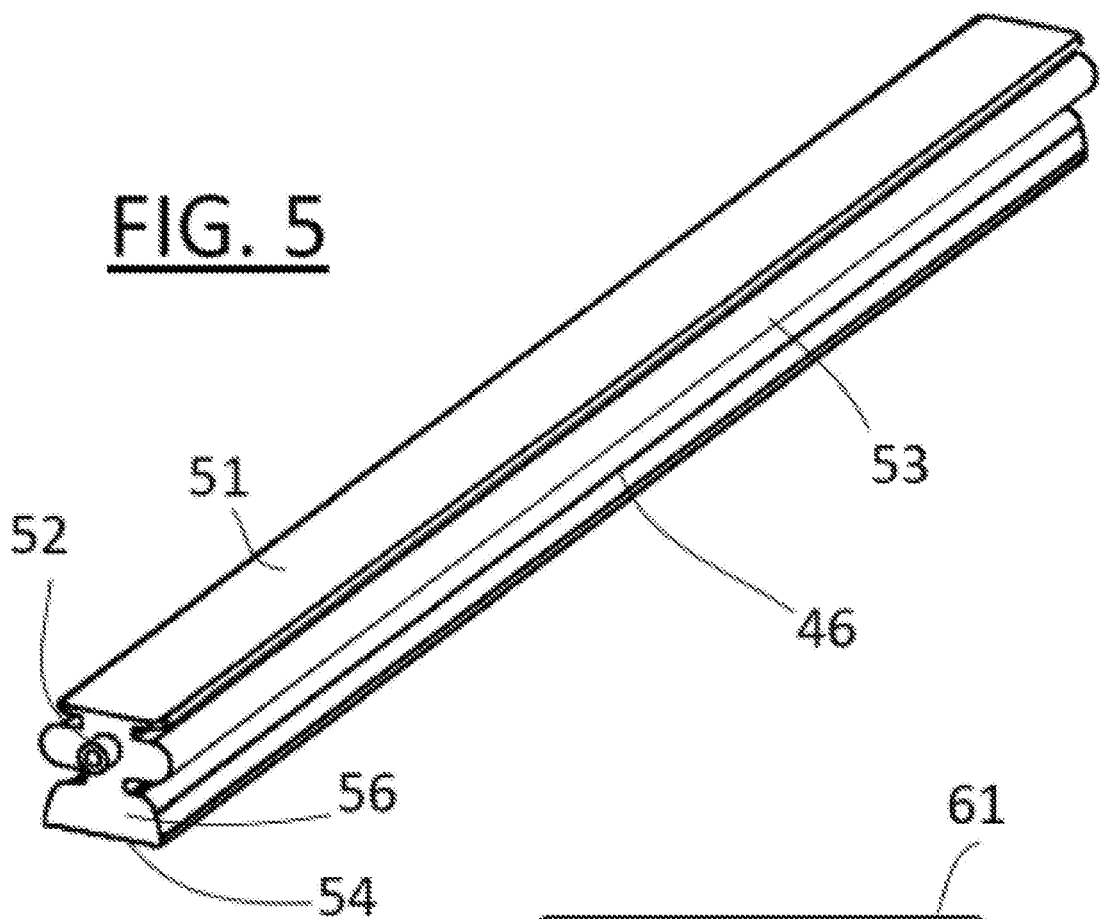
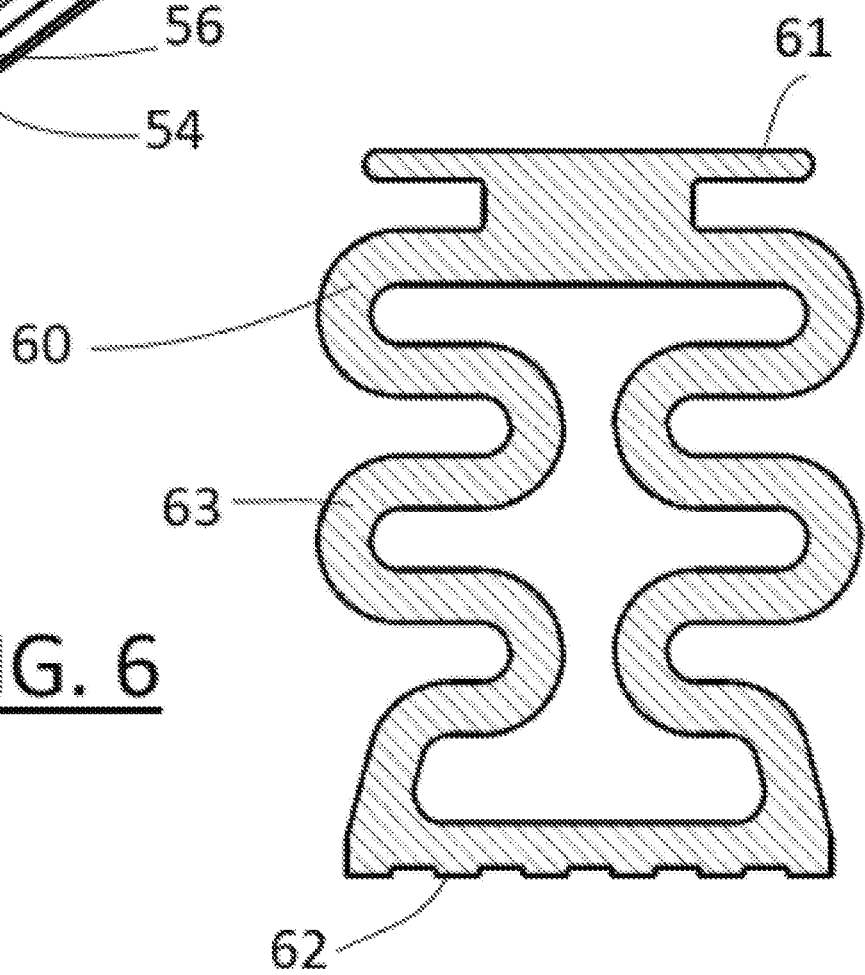

INFLATABLE PNEUMATIC STENCIL CLAMP

This invention relates to a clamping system for clamping a printing screen frame within a printing machine during a printing process, an inflatable bladder for use in a clamping system, a printing machine comprising a clamping system, and a method of clamping a printing screen frame within a printing machine.

BACKGROUND AND PRIOR ART

Currently, electronics substrates such as wafers for solar or fuel cells or a circuit board are manufactured by screen printing through a printing screen onto the substrate. In such a process a print head of a printing machine (the print head typically comprising a squeegee) is passed along a printing screen such as a stencil or mesh, to force conductive paste or ink through an aperture pattern formed in the screen and onto the substrate. It is accepted that the printing screen should be maintained under tension during the printing process, and so the printing screen is typically held within a frame which grips the edges of the screen and applies a tensioning force thereto. One such tensioning system is the VectorGuard® system. In this system a screen is provided with edge members which are fastened to the screen and act to support the screen, and a separate frame is used to engage with the edge members to apply the tensioning force in use.

It is also known that for a print process to be successful, the frame must be securely clamped within the printing machine, and so a clamping system may be provided for this purpose. Since printing screens and hence their respective frames may be of various sizes, the clamping system should be able to cater for a wide range of frame sizes, so that any standard frame may be securely clamped within the printing machine.

An exemplary known clamping system 1 for a printing machine is schematically shown in FIG. 1. For clarity, an axis system is also shown, with X denoting the printing axis, i.e. the axis along which a print head would be moved to effect printing, Y denoting a lateral axis, and Z denoting an axis orthogonal to X and Y. Generally, the X-Y plane would lie in the horizontal plane, while Z would extend vertically. Two basic parts are shown, an outer "chase" 2 and a receptacle 3, which includes a pair of inner elongate clamping rails 4a, 4b. For illustration, a printing screen 5 is also shown supported within a frame 6, the frame 6 being received within the receptacle 3 and clamped to the clamping rails 4a, 4b.

The chase 2 is used to correctly align the clamping rails 4a, 4b, and hence frame 6, with respect to the print head (not shown). As shown, the chase 2 comprises a substantially U-shaped arrangement of beams, more particularly two relatively long lateral beams 7a, 7b with a connecting beam 8 positioned therebetween. Four lugs 9 project from the lateral beams 7a, 7b. These lugs 9 are mounted on corresponding support areas of the printing machine (not shown) via bearings, so that the entire chase 2 is movable relative to the printing machine. Both the position in the X-Y plane and the rotation within the X-Y plane, of the chase 2 relative to the printing machine are controlled by chase actuators 10, and actioned automatically. The clamping rails 4a, 4b are supported both at a guide bar (not visible) located beneath the connecting beam 8 and by a front rail support 11 carried by the chase 2, so that they lie below the level of the beams 7a, 7b and 8. The clamping rails 4a, 4b are selectively movably supported, such that when a locking system 20 is released, the lateral distance between them can be adjusted. It should be noted that the lateral beams 7a, 7b are profiled on their lower edges such that the respective clamping rail 4a, 4b can be located underneath the beam 7a, 7b.

Each clamping rail 4a, 4b comprises a substantially L-shaped support 12a, 12b on which the frame may be supported, with the support formed from a horizontal ledge 13a, 13b on which the frame may lie and an upright wall 14a, 14b. Each support 12a, 12b runs along substantially the entirety of the respective rail's length, so that a range of differently sized frames may be supported. In some configurations, it may alternatively be possible to retain more than one frame at a time on the supports 12a, 12b. The upright wall 14a, 14b of the support 12a, 12b contacts side walls of the frame 6, helping to prevent lateral motion of the frame 6 relative to the support 12a, 12b in the ±Y direction. Disposed adjacently and outwardly of the supports 12a, 12b is a clamping mechanism, comprising, on each clamping rail 4a, 4b: a drive rod 15a, 15b extending along the clamping rail 4a, 4b and guided by bearings and guides 16, a drive rod actuator 17a, 17b for driving the drive rod 15a, 15b along its axis, and a plurality of clamping fingers 18 mechanically connected to the drive rod 15a, 15b by respective links 19. It is important that the frame 6 is positioned correctly along the rails 4a, 4b, i.e. along the X axis, before clamping. This positioning is generally achieved by a physical positioning stop (not shown), against which the frame 6 abuts. In some machines, the frame 6 may be automatically moved into position, for example by a paddle (not shown) which may for example be attached to the print head. Alternatively, the frame 6 may simply be pushed into position by an operator, i.e. until it abuts the positioning stop. To then clamp the frame 6 into place, the actuators 17a, 17b, which may be pneumatic or electrical, are activated by a separate control system (not shown) such as a computer, processing means or the like, to drive the respective drive rods 15a, 15b in an axial direction. This movement causes the links 19 to be displaced, which in turn causes the clamping fingers 18 to rotate and press down on the frame 6, applying a clamping force thereto. In the apparatus shown, there are three clamping fingers 18 on each clamping rail 4a, 4b. With the relatively small frame 6 shown, only two clamping fingers 18 on each rail 4a, 4b contact the frame in use. If larger frames are used, then the third clamping finger 18 may additionally contact the frame. When it is required to remove the frame 6, the actuators 17a, 17b are caused to reverse, moving the respective drive rods 15a, 15b in the opposite axial direction so that the clamping fingers 18 release from engagement with the frame 6. The frame 6 may then be removed from the printing machine.

Generally, the frame loading operation sequence is as follows:
i) an operator unlocks the locking system and moves the rails 4a, 4b to an approximate required lateral (Y) distance,
ii) a frame 6 is inserted onto the rails 4a, 4b (and as noted above placed at the required distance along the X axis),
iii) the rails 4a, 4b are moved to the required lateral distance (i.e. at which the frame is in contact with the walls of the clamping rails),
iv) the locking system is re-locked,
v) drive rod actuators 17a, 17b are activated to force the clamping fingers 18 down onto the frame, and
vi) the chase 2 is moved into the required horizontal and rotational position.

Depending on the printing machine, various or all of the above operations may be performed automatically.

Such known clamping systems have generally worked well. However, it has been recognised that there are also various shortcomings with such systems. For example, the above-described clamping system comprises around two hundred and fifty expensive, precision-engineered/commercial off-the-shelf parts. As a result, the clamping system may be complex and time-consuming both to assemble and to repair. Furthermore, the use of individual clamping fingers makes it problematic to achieve a uniformly distributed load along the length of frames, which may adversely affect the print quality if the stencil is warped, a problem which may be exacerbated by the requirement to use frames of different sizes. In addition, the industry is moving towards the use of higher printing forces (i.e. the pressure applied to the printing screen by the print head is higher), which require a consequentially higher clamping force to retain the frame in the correct position.

The present invention seeks to address these problems and provide an alternative clamping system which is mechanically simpler, provides a high uniformity of load, and is capable of retaining a frame in position over the entire range of envisaged printing forces.

In accordance with the present invention, this aim is achieved by the use of an inflatable bladder, such as a pneumatically-actuated bladder, to effect clamping.

SUMMARY OF THE INVENTION

In accordance with a first aspect of the present invention there is provided a clamping system for clamping a printing screen frame within a printing machine during a printing process, comprising:
a receptacle for receiving a frame in use, the receptacle at least partially defining a space for accommodating the frame, and the receptacle including a frame support for supporting the frame in use,
a clamping bracket,
an inflatable bladder retained by the clamping bracket, the inflatable bladder bearing an engagement surface, and
a fluid supply for supplying fluid to the inflatable bladder to inflate it from an uninflated state to an inflated state, wherein during inflation of the inflatable bladder the engagement surface is caused to move towards the space so that in use, while the inflatable bladder is in the uninflated state a printing frame may be loaded into the receptacle, and while the inflatable bladder is in the inflated state the printing frame is clamped by the inflatable bladder to be stationary relative to the frame support.

In accordance with a second aspect of the present invention there is provided a method of clamping a printing screen frame within a printing machine, the printing machine comprising a clamping system including a receptacle for receiving the printing screen frame, the receptacle at least partially defining a space for accommodating the frame, the method comprising the steps of:
i) inserting a printing screen frame within the space; and
ii) inflating an inflatable bladder retained by a clamping bracket of the clamping system, such that an engagement surface borne by the inflatable bladder is caused to move away from the clamping bracket and towards the printing screen frame and thereby clamp the printing screen frame to the clamping system.

Other specific aspects and features of the present invention are set out in the accompanying claims.

BRIEF DESCRIPTION OF THE DRAWINGS

The invention will now be described with reference to the accompanying drawings (not to scale), in which:

FIG. 4 schematically shows a sectional view of part of the clamping system of FIG. 2, with the inflatable bladder in an inflated state;
FIG. 5 schematically shows a perspective view of the inflatable bladder of the first embodiment;
FIG. 6 schematically shows a sectional view of an inflatable bladder in accordance with a second embodiment of the present invention.

DETAILED DESCRIPTION OF THE PREFERRED EMBODIMENTS OF THE INVENTION

Figure 1:
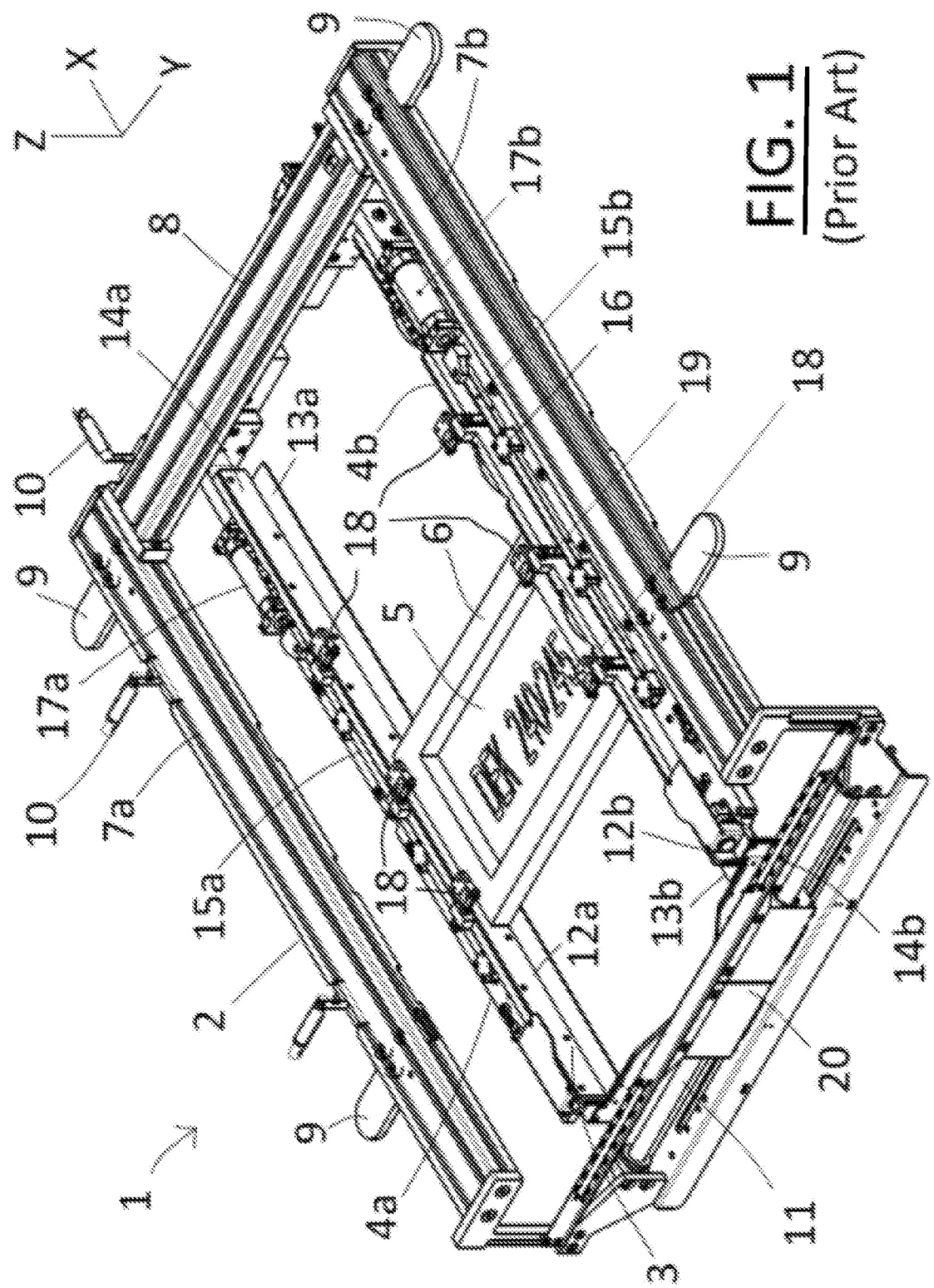
FIG. 1 schematically shows a perspective view of a known clamping system,
FIG. 2 schematically shows a perspective view of a first exemplary clamping system in accordance with the present invention.
Figure 2:
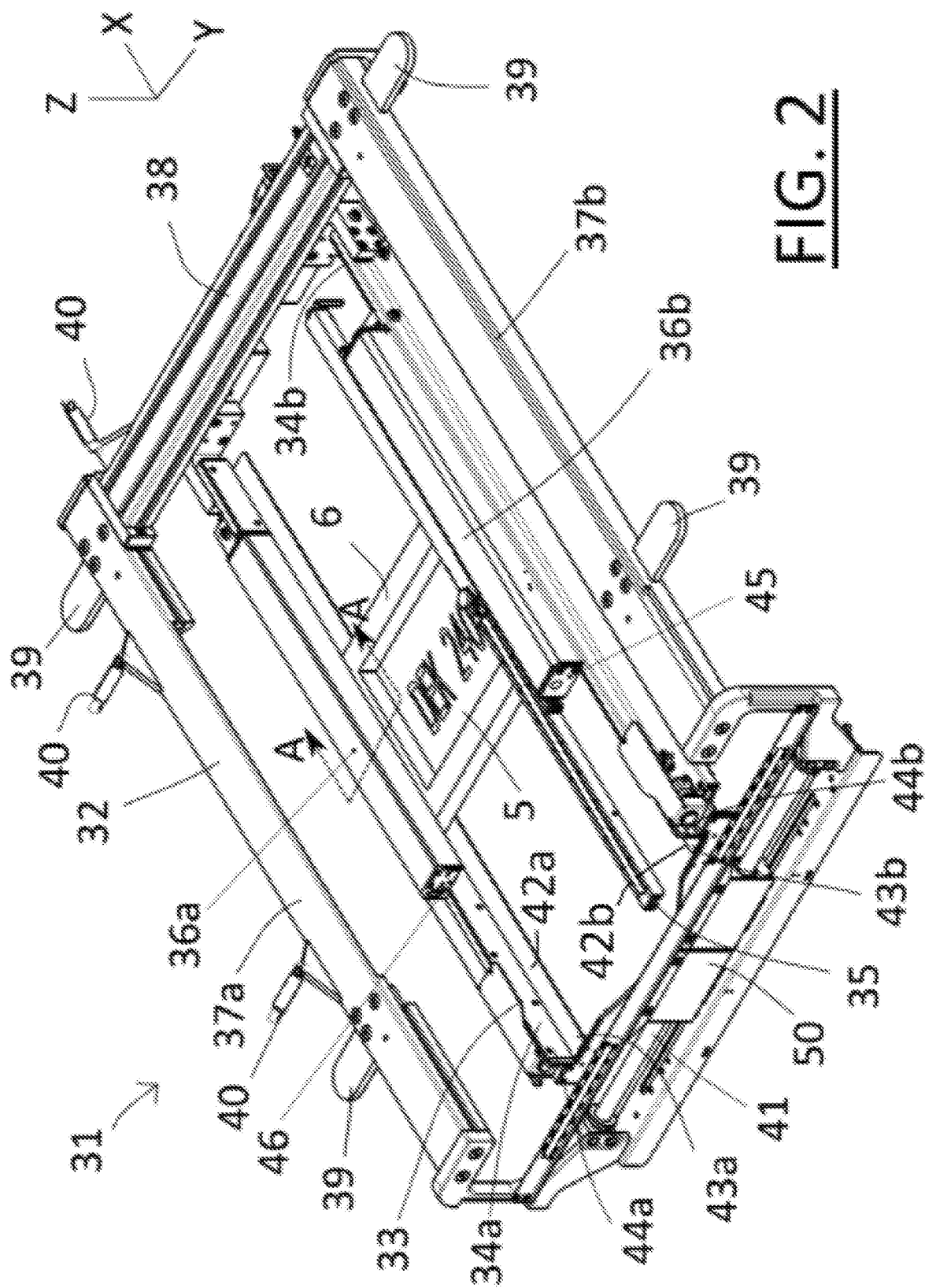

A perspective view of an embodiment of the present invention is schematically shown in FIG. 2, in a non-clamping state. A clamping system 31 shown has various similarities to that shown in FIG. 1, and so need not be discussed in detail. In particular, a chase 32 is structurally and functionally similar to that shown in FIG. 1, having two relatively long lateral beams 37a, 37b linked by a connecting beam 38, a guide bar (not visible) below the connecting beam 38 and a front rail support 41, with four lugs 39 projecting from the lateral beams 37a, 37b. The chase 32 is moved relative to the printing machine (not shown) by chase actuators 40, and actioned automatically.

Similarly, clamping system 31 also includes a receptacle 33, which includes first and second clamping rails 34a, 34b generally similar to those shown in FIG. 1, supported by the connecting beam 38 and front rail support 41 of chase 32, so that they lie below the level of the beams 37a, 37b, 38. The clamping rails 34a, 34b are selectively movably supported, such that when a locking system 50 is released, the lateral distance between them can be adjusted. It should be noted that the lateral beams 37a, 37b are profiled on their lower edges (in a different way to those of FIG. 1), such that the respective clamping rail 34a, 34b can be located underneath the beam 37a, 37b.

Each clamping rail 34a, 34b comprises a substantially L-shaped support 42a, 42b on which a frame may be supported. A printing frame 6, holding printing screen 5, is shown supported by the supports 42a, 42b. The supports 42a, 42b are formed from respective horizontal ledges 43a, 43b on which the frame may lie and an upright wall 44a, 44b. Each support 42a, 42b runs along substantially the entirety of the respective rail's length, so that a range of differently sized frames may be supported. In some configurations, it may be possible to retain more than one printing frame at a time on the supports 42a, 42b. The upright walls 44a, 44b of the supports 42a, 42b contact upright (i.e. extending parallel to the Z-axis) side walls of the printing frame 6, helping to prevent lateral motion of the printing frame 6 relative to the support 42a, 42b in the ±Y direction. Also shown is a frame positioning member 35, which includes an operator-settable physical stop, for accurately locating the printing frame 6 at the correct position along the X-axis, as is known in the art per se.

Each clamping rail 34a, 34b carries a respective elongate clamping bracket 36a, 36b, which extends along a portion of the rail. The clamping brackets 36a, 36b, as will be described in more detail below, are formed as channels, with their ends covered in use by respective cover plates. In FIG. 2, clamping bracket 36b is shown with a cover plate 45 in place, while clamping bracket 36a has its cover plate removed so that the interior can be seen. Each clamping bracket 36a, 36b houses and retains an inflatable bladder 46. A fluid supply (not shown in FIG. 2) for supplying pressurised fluid to the inflatable bladder to effect inflation of the same is also provided. In a preferred embodiment the fluid supply is pneumatic, and the fluid supply may connect to other pneumatic systems of the printing machine. However, any other fluid may be used, including other gases, oil or a hydraulic system. In a preferred embodiment, the fluid supply to the inflatable bladder 46 is pressurised at a desired working inflated pressure of the inflatable bladder 46. The pressure of the fluid supply may be controlled using regulators or restrictors (not shown), as is well known per se. In a preferred embodiment, a vacuum source (not shown) is provided, the vacuum source being fluidly connectable to the inflatable bladder 46, to deflate the bladder 46 at the end of a clamping operation. In alternative embodiments, deflation may be achieved relatively simply by venting the inflatable bladder 46 to the ambient atmosphere, for example by providing a venting valve (not shown) in fluid communication with the inflatable bladder 46.

Figure 3:
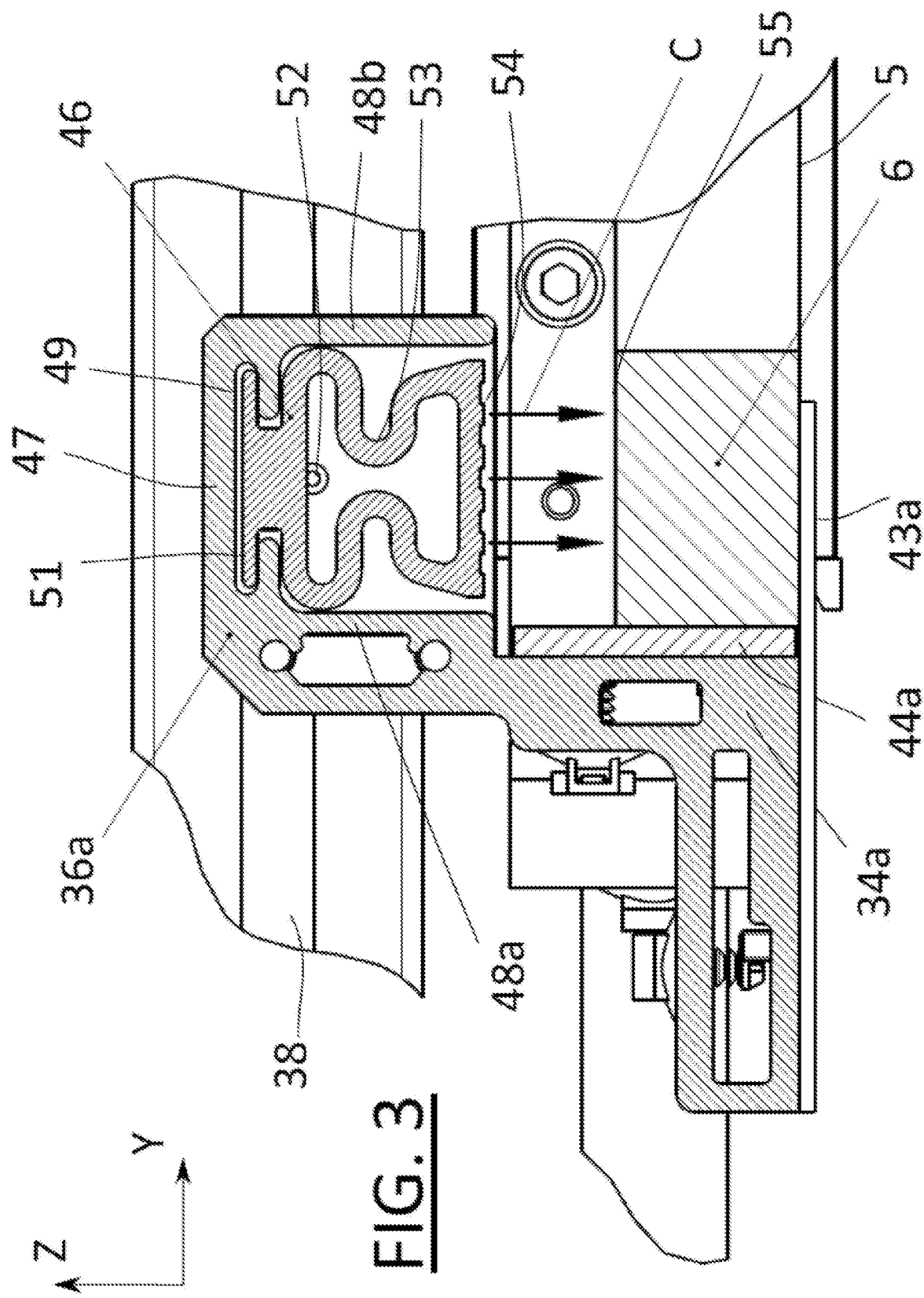
FIG. 3 schematically shows a sectional view of part of the clamping system of FIG. 2, with the inflatable bladder in an uninflated state.

FIG. 3 schematically shows a sectional view of part of the clamping system 31, taken along the line A-A of FIG. 2, while the inflatable bladder 46 is in an uninflated state. Clamping rail 34a with clamping bracket 36a is formed as a unitary extrusion, for example from aluminium. Various conduits are shown extending through the extrusion—these are provided to reduce the weight of the component and maintain a substantially constant wall thickness, and do not materially affect the operation of the clamping system. In this figure, it can be seen more clearly that the clamping bracket 36a comprises a substantially U-shaped channel, as shown this is an inverted U-shape, having a base 47 and two opposing sidewalls 48a, 48b. The outermost sidewall 48a, i.e. that one furthest away from the receiving space, is integrally formed with clamping rail 34a, and projects from an upper surface thereof, such that the channel overhangs the supporting ledge 43a. The base 47 has a female engagement section 49 in the form of a shaped recess formed therein. The inflatable bladder 46 includes a correspondingly shaped male anchoring section 51, which can be slid into the engagement section 49 in the axial direction (i.e. along the X-axis direction) so as to retain the inflatable bladder 46 within the clamping bracket 36a. The anchoring section 51 and engagement section 49 together form mutually cooperative sections, such that during cooperation therebetween, the inflatable bladder 46 is retained by the clamping bracket 36a. The simple sliding engagement between the inflatable bladder 46 and the clamping bracket 36a permits the bladders to be replaced, or exchanged for bladders of different dimension in a modular fashion, as will be described in more detail below. With the inflatable bladder 46 inserted into the clamping bracket 36a, the cover plate 45 (see FIG. 2) may be positioned on the end of the bracket to constrain the bladder in the axial direction. The inflatable bladder 46 includes a fluid inlet/outlet port 52 at an end thereof, which forms part of the fluid supply system. This port 52 must be fluidly connected to the fluid supply before the clamping system can be used. The lateral sides of the inflatable bladder 46 comprise extendable bellows 53 in the form of a folded section of bladder, which enable the inflatable bladder 46 to inflate to the required extent in the clamping direction C, as will be described in more detail below. The distal surface of the inflatable bladder 46, i.e. that surface furthest from the engagement section 51, bears an engagement surface 54, in this embodiment the engagement surface 54 is integrally formed with the inflatable bladder 46. The engagement surface 54 is profiled so as to increase friction with the upper edge of frame 6 during clamping, and may optionally have a greater thickness and/or stiffness than the lateral sides of the inflatable bladder, so as to prevent distortion of this surface during inflation. Alternatively, this benefit may be achieved by including embedded internal reinforcement members, such as a wire grid, within the engagement surface 54. Suitable materials for the inflatable bladder 46 include elastically deformable materials such as natural or synthetic rubbers and other polymers. A presently preferred material is EPDM (ethylene propylene diene monomer) rubber loaded with carbon black to ensure adequate discharge of static electricity. The engagement surface 54 may have a width in the range from about 20 mm to about 50 mm, optionally in the range from about 30 mm to about 40 mm. The unextended height of the inflatable bladder 46 may lie in the range from about 25 mm to about 50 mm, optionally in the range from about 30 mm to about 40 mm.

It can be seen from FIG. 3 that the engagement surface 54 of the inflatable bladder 46 is arranged directly above, and parallel with, an upper surface 55 of the frame 6, more particularly the upper surface of one side of the frame 6. During inflation of the inflatable bladder 46, the engagement surface 54 moves down towards surface 55, typically by a distance in the range 5 mm to 25 mm, while remaining parallel therewith, due to both the shape of the inflatable bladder 46 and the presence of the sidewalls 48a, 48b, which laterally restrain the inflatable bladder 46 and constrain its extension to the vertical (Z-axis) direction.

Clamping rail 34b, located on the opposing side of the frame receiving space, is constructed in a similar manner to clamping rail 34a.

FIG. 4 is similar to FIG. 3, though showing the inflatable bladder 46 in an inflated state, i.e. following supply of fluid to the inlet/outlet port 52. Here it can be seen that the bellows 53 has extended and unfolded due to the increased fluid pressure within the inflatable bladder 46. The extension of the inflatable bladder 46 is such that the engagement surface 54 is moved into contact with the upper surface 55 of the printing frame 6, and acts to apply a clamping force in the clamping direction C to "sandwich" the printing frame 6 between the engagement surface 54 and the supporting ledge 43a. It should be noted that if the printing frame 6 were not present, the engagement surface 54 would lie in a position below that shown. It should be noted that FIG. 4 shows the inflatable bladder 46 in an idealised state—in practice the bladder will tend to bulge outwardly where unconstrained, for example in the region below sidewall 48b. This bulging does not adversely affect the clamping capability of the bladder.

Once the inflatable bladder 46 reaches its inflated state, transfer of fluid to the inflatable bladder 46 may be switched off and locked using a simple valve (not shown), so that fluid neither enters nor leaves the inflatable bladder 46 during the clamping, i.e. during the printing process. When the printing process is complete, and it is desired to remove the printing frame from the printing machine, the valve is released so that fluid may be expelled from the inflatable bladder 46, causing it to retract to its uninflated state. In an alternative embodiment, the inflatable bladder 46 may be permanently attached to the pressurised fluid supply throughout the clamping process, this supply only being turned off when it is desired to return the inflatable bladder 46 to its uninflated state. Preferably, the inlet/outlet port 52 is used both for fluid ingress and egress, since any fitting in the wall of the inflatable bladder 46 is a potential source of leaks and weakness, however, in alternative embodiments separate ports for fluid ingress and egress may be provided.

As noted above, the inflatable bladder 46 may be slidably engaged and removed from the clamping brackets 36a, b as required, allowing a variety of bladders to be used for particular purposes, for example to provide effective clamping of frames of different thicknesses. A variety of possible inflatable bladder arrangements are schematically shown in FIGS. 5 to 9.

FIG. 5 schematically shows inflatable bladder 46 in a perspective view, when removed from a clamping bracket 36a, 36b. The inlet/outlet port 52 is located in an end wall 56 of the inflatable bladder 46, the other end of inflatable bladder 46 is closed with another end wall. It should be noted that the end sections of the inflatable bladder 46 near these end walls will not be able to inflate as much as more central regions, since the end walls themselves restrict expansion. For this reason, it is advantageous that the inflatable bladder 46 has an axial length greater than the frame it will be clamping in use, such that regions of the inflatable bladder 46 near the end walls do not overlie the printing frame.

FIG. 6 schematically shows a sectional view of an inflatable bladder 60 in accordance with a second embodiment of the present invention. This inflatable bladder 60 is generally similar to the inflatable bladder 46 of the first-described embodiment, in particular having a similar anchoring section 61 and engagement surface 62. However, inflatable bladder 60 includes an extended bellows 63 in comparison to that of the first embodiment, taking the form of an additional fold in the wall of the bladder. This bellows 63 permits the inflatable bladder 60 to extend to a greater length when inflated, and thus may be of utility when it is desired to clamp and print a relatively thin printing frame for example.

Different inflatable bladders may be easily swapped in and out of the clamping brackets. To achieve this, the fluid supply would be disconnected from the inflatable bladder, the respective cover plate (45, see FIG. 2) would be removed, and then the inflatable bladder may be slid out of the clamping bracket. These steps would be reversed to insert a new inflatable bladder.

Figure 7:
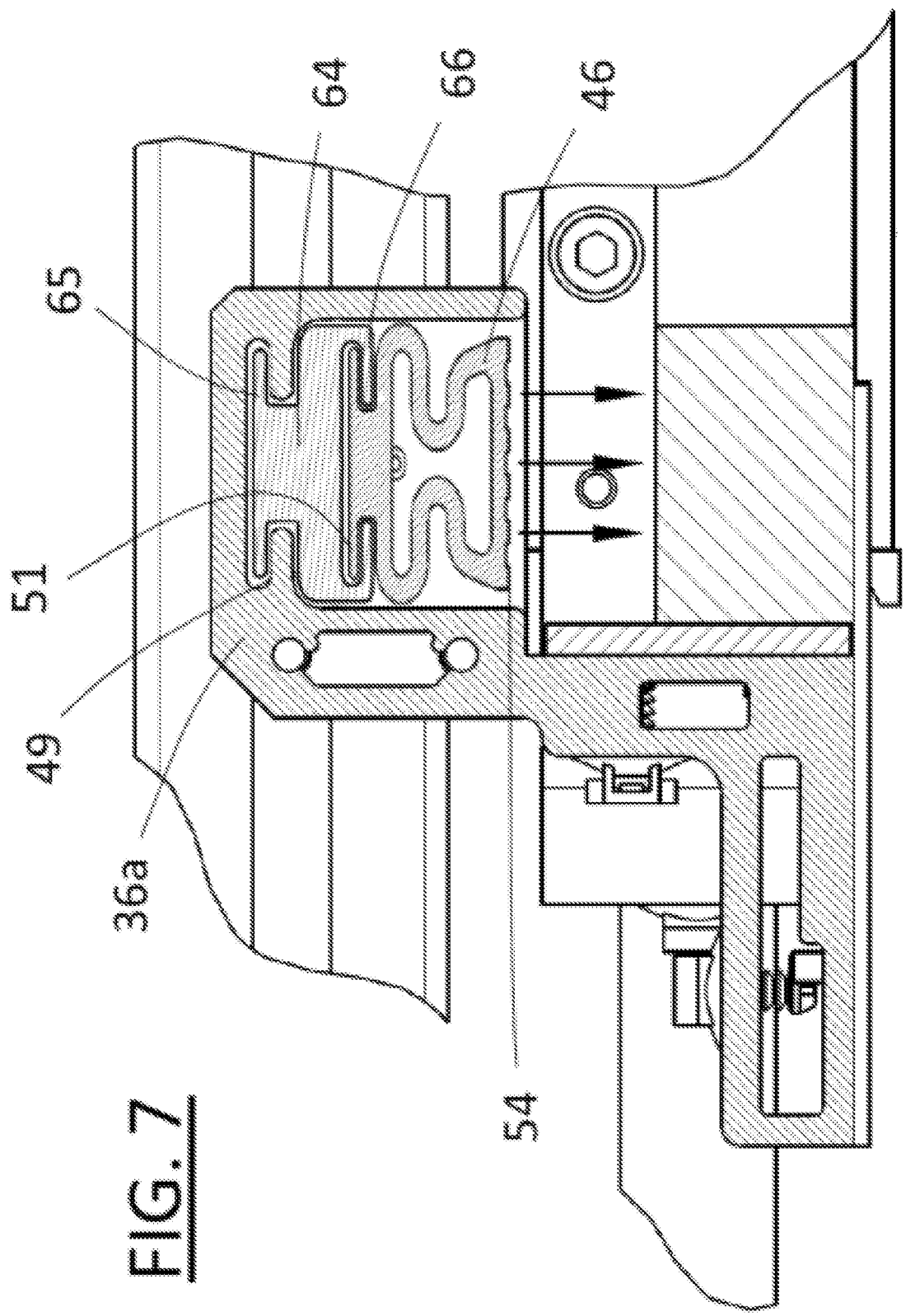
FIG. 7 schematically shows a sectional view of components of a modular system in accordance with a third embodiment of the present invention.

FIG. 7 schematically shows a modular system that may be used to provide optional and selective control of the movement of the engagement surface in the clamping direction. The clamping brackets 36a, 36b (see FIG. 2) are as described with reference to the previously-described embodiments. Here, an inflatable bladder 46 identical to that of the first-described embodiment above is provided, as well as an insert 64. The insert 64 comprises an elongate solid body of similar width and length to inflatable bladder 46. An upper surface of insert 64 comprises a male anchoring section 65 shaped so as to slidably engage with the female engagement section 49 of the clamping brackets 36a and 36b (see FIG. 2). The anchoring section 65 and engagement section 49 together form mutually cooperative sections, such that during cooperation therebetween, the insert 64 is retained by the clamping bracket 36a. A lower surface of the insert 64 comprises a female engagement section 66 shaped so as to slidably engage with the male anchoring section 51 of inflatable bladder 46. The anchoring section 51 and engagement section 66 together form mutually cooperative sections, such that during cooperation therebetween, the inflatable bladder 46 is retained by the insert 64. The insert 64 may therefore be slidably inserted between the clamping bracket and the inflatable bladder, while providing a secure mechanical connection therebetween. With an insert 64 thus inserted, the engagement surface 54 of the inflatable bladder 46 would be operable to move to a lower height during inflation of the inflatable bladder 46. Again this may be beneficial for clamping relatively thin printing frames. Insert 64 may be formed from a wide variety of materials, such as a metal, for example steel, iron, aluminium, or a plastics material, carbon fibre, rubber etc.

Advantageously, in such a modular system, a plurality of inserts would be provided. An operator would then be able to select an optimal combination of inflatable bladder and if necessary, one or more inserts, noting that each insert is able to connect directly to another insert to form a "stack" by virtue of the complementary engagement sections and anchoring sections. The inserts may also be provided in a variety of differing heights, i.e. the distance between the upper and lower surfaces of the insert, so that further control of the clamping is possible. Differently-sized inflatable bladders, such as that shown in FIG. 6, may also be provided.

Figure 8:
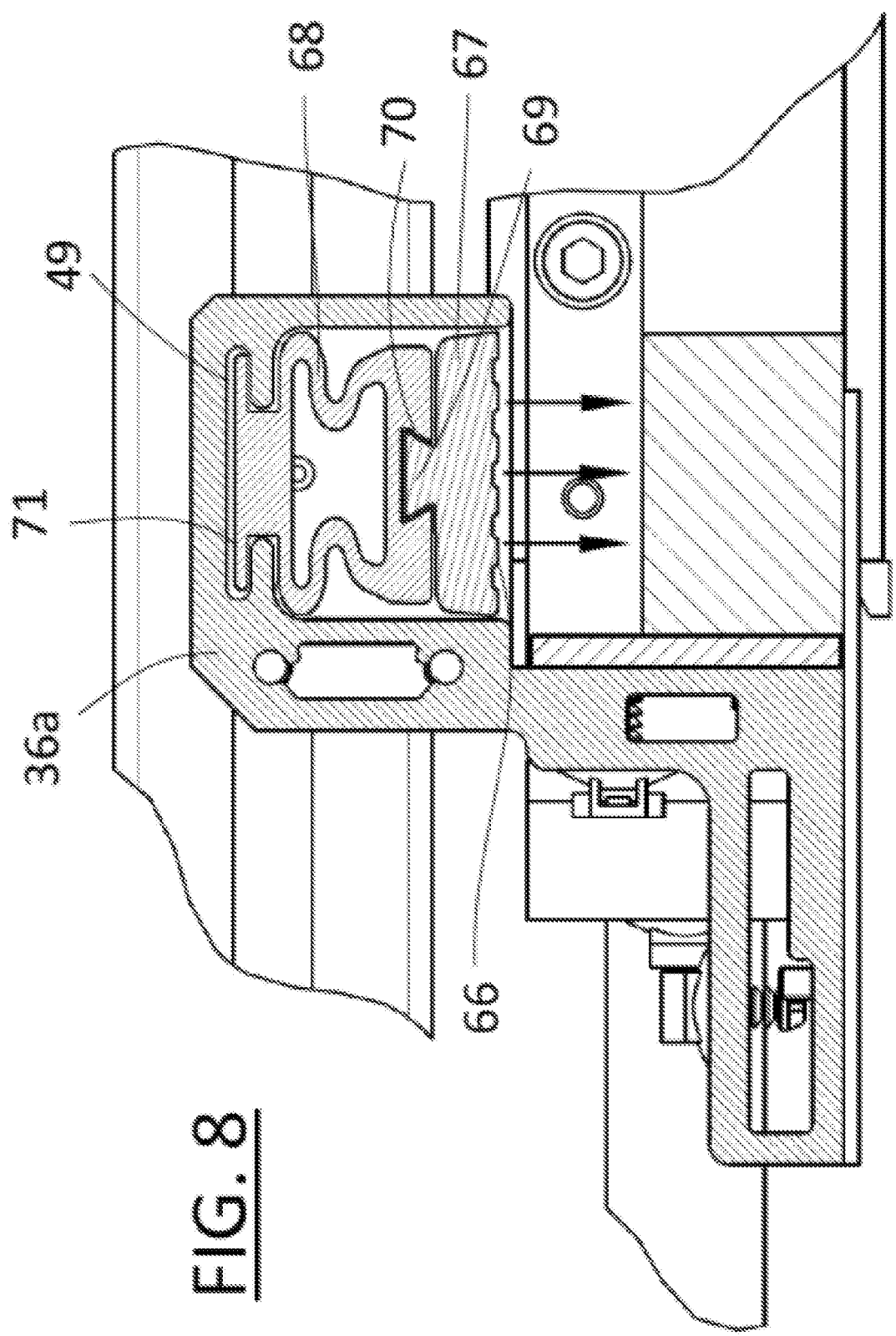
FIG. 8 schematically shows a sectional view of components of a modular system in accordance with a fourth embodiment of the present invention.

FIG. 8 schematically shows components of an alternative modular system that may be used to provide optional and selective control of the movement of the engagement surface in the clamping direction. The clamping brackets 36a, 36b (see FIG. 2) are as described with reference to the previously-described embodiments. In this embodiment, an engagement surface 66 is formed on the lower surface of an insert 67, which in turn is borne or carried by an inflatable bladder 68. An upper surface of the insert 67 comprises a male anchoring section 69 shaped so as to slidably engage with a female engagement section 70 formed in a lower surface of the inflatable bladder 68. The anchoring section 69 and engagement section 68 together form mutually cooperative sections, such that during cooperation therebetween, the insert 67 is retained by the inflatable bladder 68. The inflatable bladder 68 includes a male anchoring section 71, which can be slid into the correspondingly-shaped engagement section 49 of the clamping bracket 36a in the axial direction so as to retain the inflatable bladder 68 within the clamping bracket 36a. The anchoring section 71 and engagement section 49 together form mutually cooperative sections, such that during cooperation therebetween, the inflatable bladder 68 is retained by the clamping bracket 36a. The simple sliding engagement between the inflatable bladder 68 and the clamping bracket 36a permits bladders to be replaced, or exchanged for bladders of different dimension in a modular fashion.

It should be noted that one or more inserts 64, as described with reference to FIG. 7, may also be inserted as required between inflatable bladder 68, in engagement with its anchoring section 71, and the engagement section 49 of the clamping brackets 36a and 36b (see FIG. 2). In addition, alternative inflatable bladders, for example of differing maximum inflation extent such as described with reference to FIG. 6, may be inserted as required. Furthermore, the insert 67 with its engagement surface 66 may be replaced by other inserts of differing dimensions as required.

Figure 9:
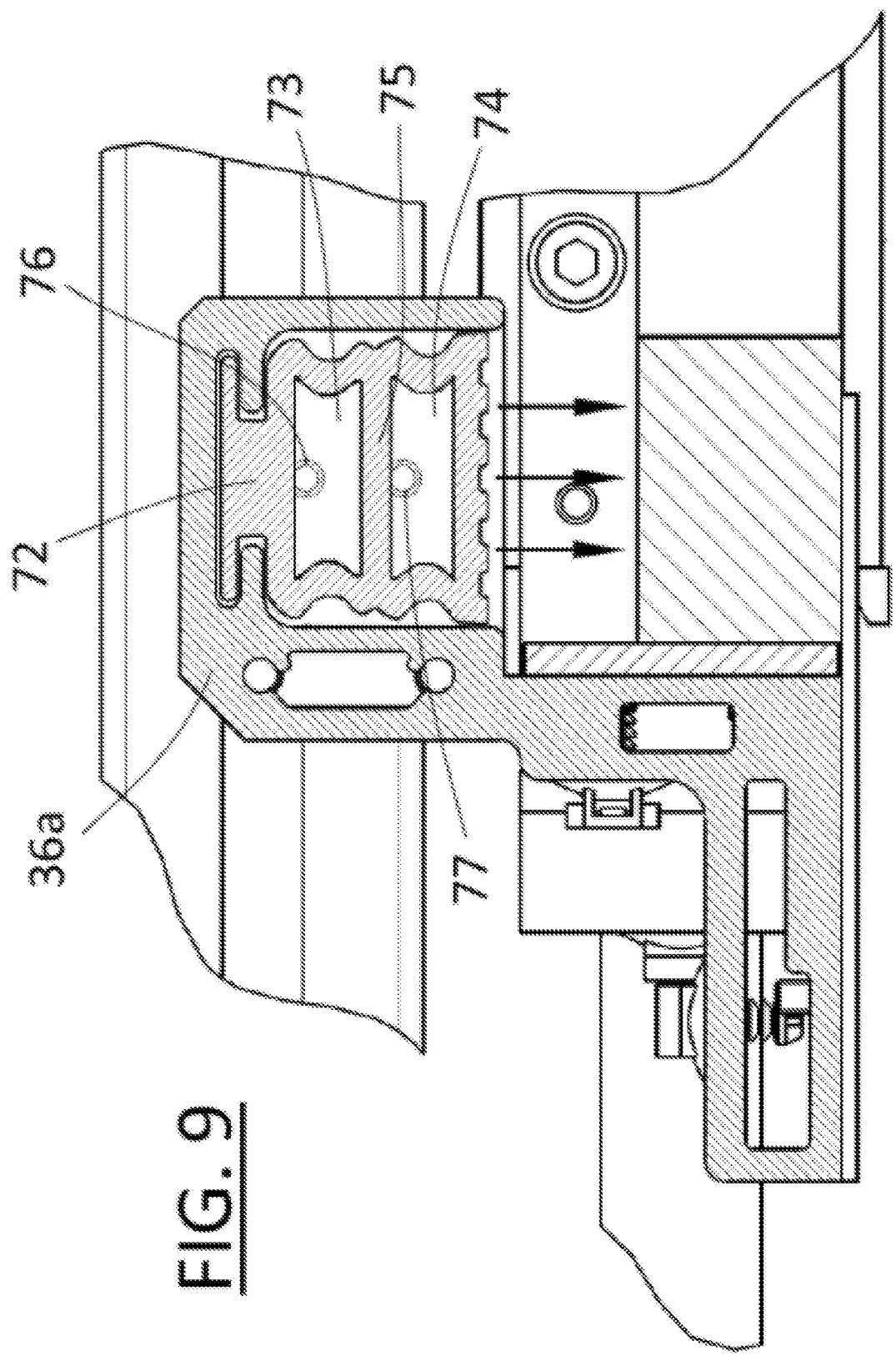
FIG. 9 schematically shows a sectional view of a fifth embodiment of the present invention.

FIG. 9 schematically shows a further embodiment of the present invention, which may provide an extended range of travel for the engagement surface. The clamping brackets 36a, 36b (see FIG. 2) are as described with reference to the previously-described embodiments, however in this embodiment, an alternative form of inflatable bladder is used. Inflatable bladder 72 has a more complex internal construction than previously-described bladders, including first and second internal chambers 73, 74, separated by a diaphragm 75 extending laterally through the inflatable bladder 72, so as to block fluid transfer between the chambers. Each chamber 73, 75 has an associated fluid inlet/outlet port 76, 77, connected to respective lines of a common fluid supply. The fluid supply to each chamber may be controlled individually and independently.

It should be noted that one or more inserts 64, as described with reference to FIG. 7, may be inserted as required between inflatable bladder 72 and the clamping brackets 36a and 36b (see FIG. 2). This type of two-chamber inflatable bladder may also be adapted to bear or carry an insert with an engagement surface, similar to that shown in FIG. 8.

Figure 10:
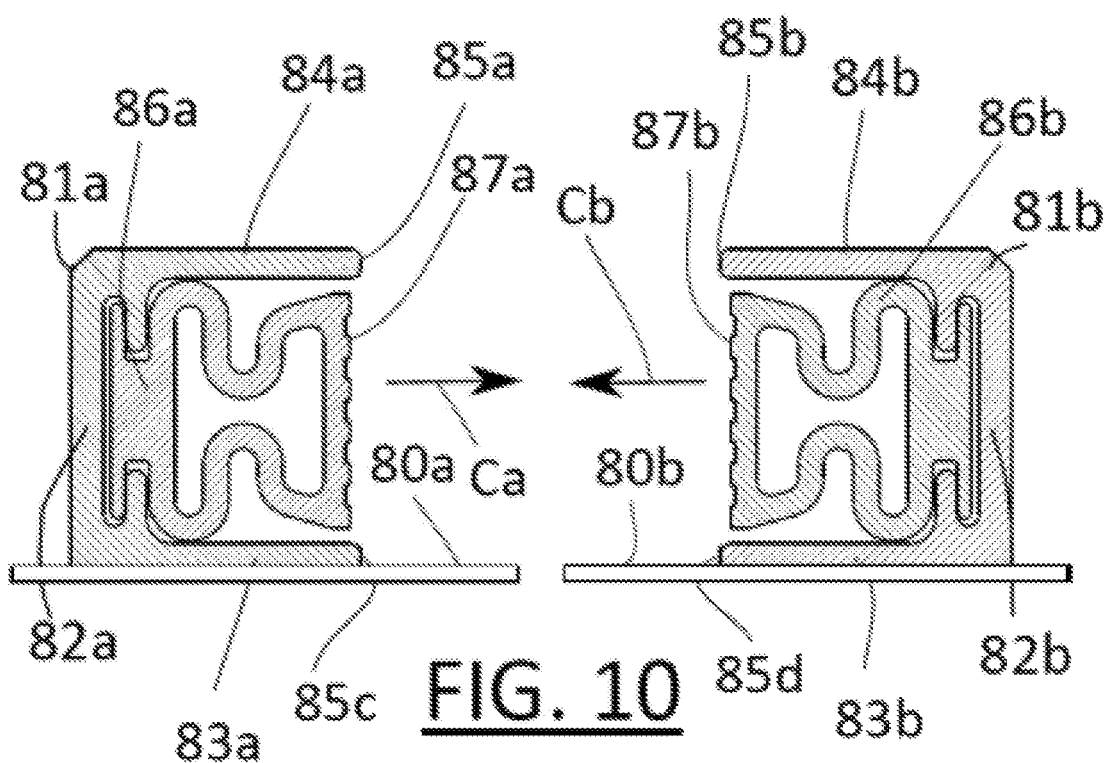
FIG. 10 schematically shows a sectional view of a sixth embodiment of the present invention.

FIG. 10 schematically shows a sectional view of a sixth embodiment of the present invention, in which a lateral clamping arrangement is used. For clarity, details of the clamping rails etc. have been omitted. Each clamping rail comprises a horizontally-arranged (i.e. parallel to the X-Y plane) supporting ledge 80a, 80b, for supporting a printing frame thereon in use, within the horizontal plane. Each supporting ledge 80a, 80b is affixed to a respective clamping bracket 81a, 81b, which comprises a substantially U-shaped channel having a base 82a, 82b and two sidewalls 83a, 83b, 84a, 84b. As shown, these channels open toward the centre of the apparatus, i.e. toward the space for accommodating the frame. The distal ends 85a-d of sidewalls 83a, 83b, 84a, 84b form a lateral support for the printing frame in use, so that the frame is initially laterally positioned by abutment against these distal ends. Located within each of the clamping brackets 81a, 81b is an inflatable bladder 86a, 86b, bearing a respective engagement surface 87a, 87b. These inflatable bladders, and their attachments to respective bases 82a, 82b are as described with reference to the embodiment shown in FIG. 3 for example. Since the inflatable bladders 86a, 86b are mounted in an opposed configuration, their respective clamping directions Ca, Cb are opposingly directed.

With this arrangement, the engagement surfaces 87a, 87b move laterally towards the space during inflation, so as to engage upright sides of the printing frame. This acts to "sandwich" the printing frame between the two inflatable bladders 86a, 86b. While this type of lateral clamping system would not serve to counteract any warping of the printing frame, it is of smaller vertical dimension, and so may be preferred in some applications.

It should be noted that one or more inserts 64, as described with reference to FIG. 7, may be inserted as required between inflatable bladders 86a, 86b and the respective clamping brackets 81a, 81b. In addition, alternative inflatable bladders, for example of differing maximum inflation extent such as described with reference to FIG. 6, may be inserted as required. Furthermore, bladder/insert arrangements such as that shown in FIGS. 8 and 9 may equally be used with such a lateral clamping system.

Figure 11:
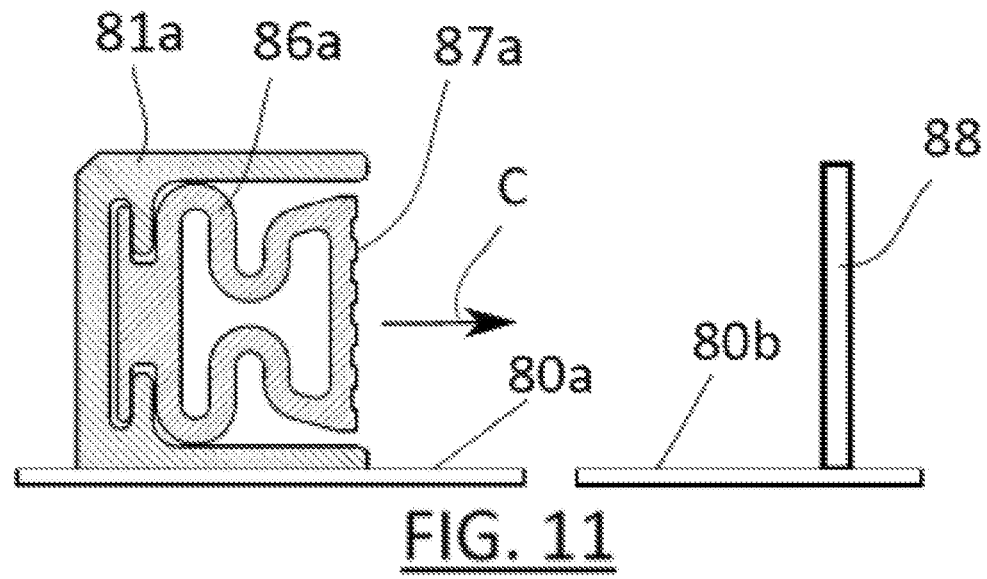
FIG. 11 schematically shows a sectional view of a seventh embodiment of the present invention.

FIG. 11 schematically shows a sectional view of a seventh embodiment of the present invention. This embodiment has many similarities to the previously-described embodiment, and so reference numerals are retained where possible.

In this embodiment, rather than using a second clamping bracket/inflatable bladder arrangement as in the previous embodiment, a lateral support 88 is instead disposed at a side of the space and at least partially within the horizontal plane, such that during inflation a printing frame is clamped between the inflatable bladder 86a and the lateral support 88.

It should be noted that one or more inserts 64, as described with reference to FIG. 7, may be inserted as required between inflatable bladder 86a and the clamping bracket 81a. In addition, alternative inflatable bladders, for example of differing maximum inflation extent such as described with reference to FIG. 6, may be inserted as required. Furthermore, bladder/insert arrangements such as that shown in FIGS. 8 and 9 may equally be used with such a lateral clamping system.

Figure 12:
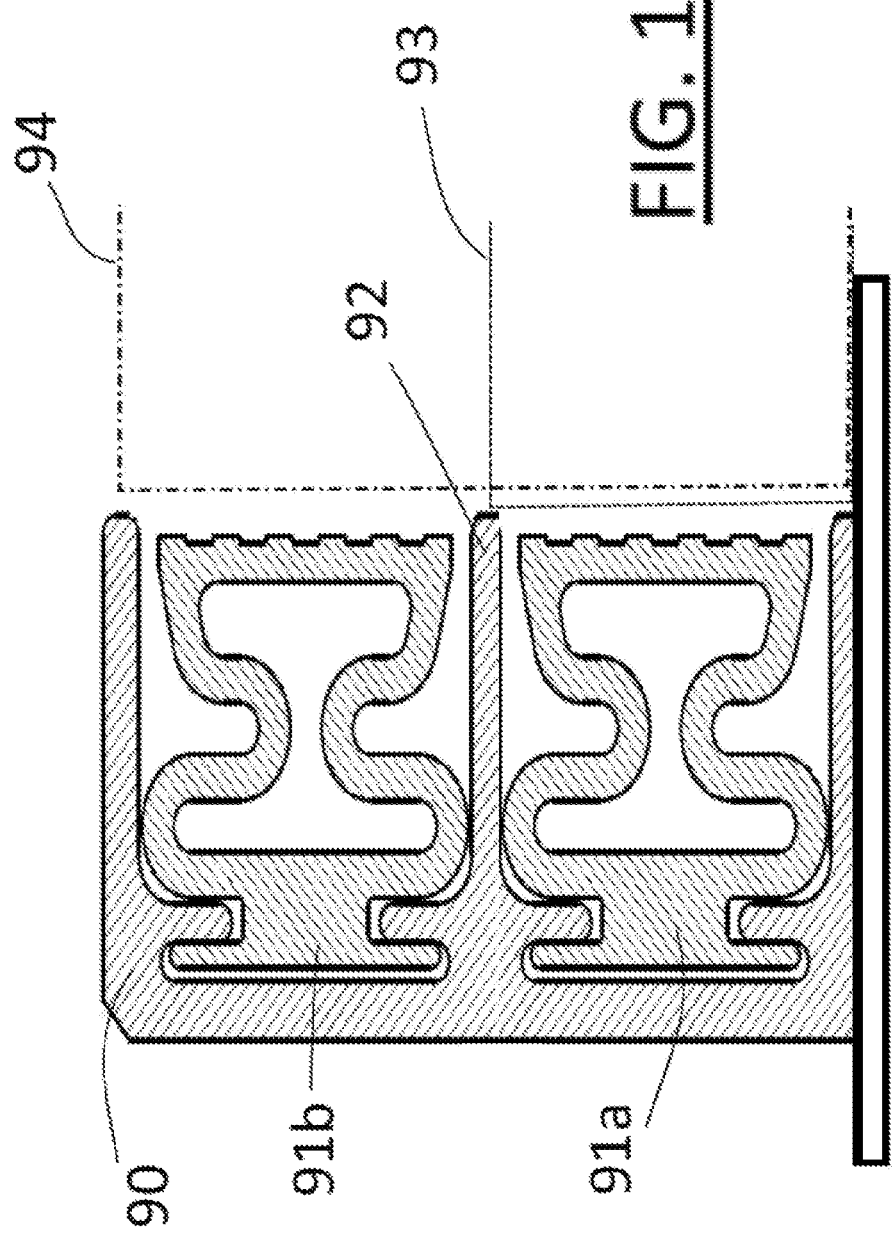
FIG. 12 schematically shows a sectional view of an eighth embodiment of the present invention.

FIG. 12 schematically shows a sectional view of an eighth embodiment of the present invention, again using a lateral clamping arrangement.

In this embodiment, a modified clamping bracket 90 is provided, which is adapted to retain two inflatable bladders 91a, 91b in a parallel, side-by-side configuration. The clamping bracket 90 includes an internal partition 92 separating the two inflatable bladders 91a, 91b, which assists in retaining the inflatable bladders 91a, 91b in the required orientation during inflation. In alternative embodiments, this partition may be removed, such that the two bladders 91a, 91b are adjacent.

Inflatable bladders 91a, 91b are provided with respective fluid inlet/outlet ports (not shown) connected to a common fluid supply (not shown), so that they are individually and independently inflatable. Therefore, if it is desired to clamp a printing frame 93 which is relatively thin, only the lower inflatable bladder 91a need be inflated. If it is desired to clamp a printing frame 94 which is relatively thick, both the lower inflatable bladder 91a and the upper inflatable bladder 91b may be inflated.

The clamping system may include a second, opposing clamping bracket with a pair of inflatable bladders to sandwich the printing frame therebetween, in a manner similar to that described with respect to FIG. 10, or alternatively a lateral support may be provided in a manner similar to that described with respect to FIG. 11.

It should be noted that one or more inserts 64, as described with reference to FIG. 7, may be inserted as required between each inflatable bladder 91a, 91b and the clamping bracket 90. In addition, alternative inflatable bladders, for example of differing maximum inflation extent such as described with reference to FIG. 6, may be inserted as required. Furthermore, bladder/insert arrangements such as that shown in FIGS. 8 and 9 may equally be used with such a lateral clamping system.

Figure 13:
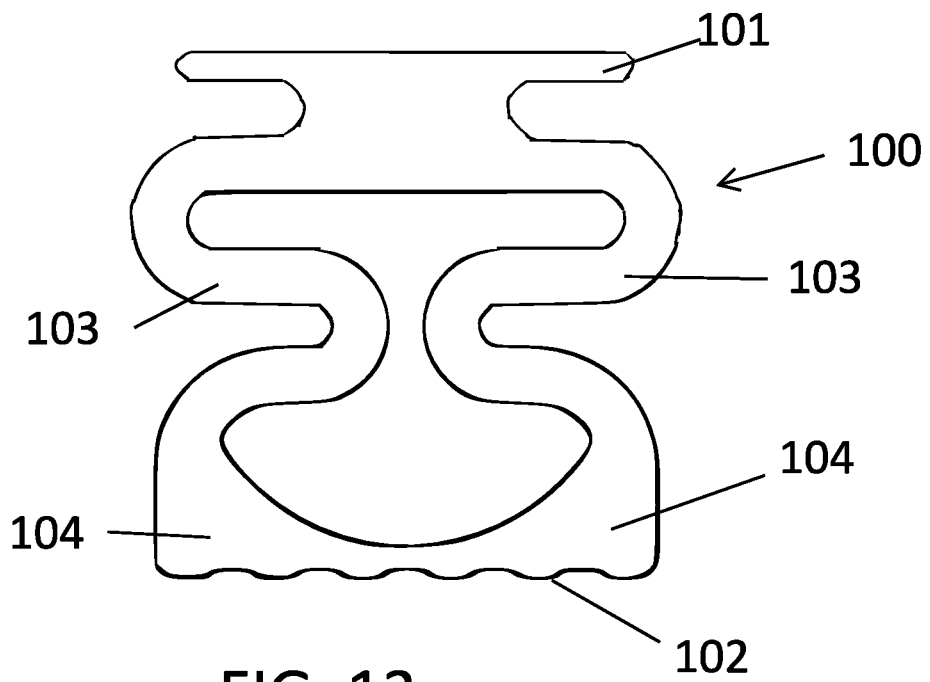
FIGS. 13 to 16 schematically show sectional views of inflatable bladders in accordance with further embodiments of the present invention.

FIGS. 13 to 16 schematically show sectional views of inflatable bladders in accordance with respective further embodiments of the present invention. The inflatable bladder 100 shown in FIG. 13 is largely similar to that shown in FIG. 3, having a similar anchoring section 101 and bellows 103, as well as a similar profiling on the engagement surface 102. Here however, the regions 104 of the wall of the bladder 100, where the bellows 103 and engagement surface 102 connected, are thickened to provide greater structural strength. This is beneficial since these regions are subject to high strain during operation.

Due to the varying thickness of the bladder wall proximate the engagement surface 102, during operation the lateral edges of the engagement surface 102 tend to contact the printing frame (not shown) before the inner section of the engagement surface 102 in use, i.e. the central region of the engagement surface tends to bend outwardly during inflation, which may place the engagement surface 102 under strain in certain usage circumstances.

Figure 14:
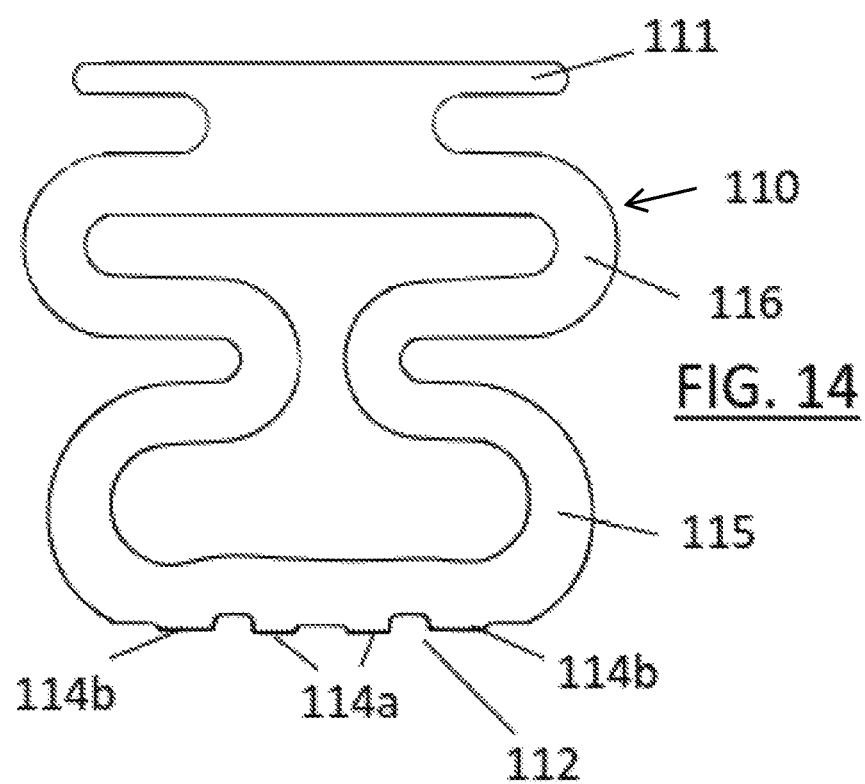
Figure 15:
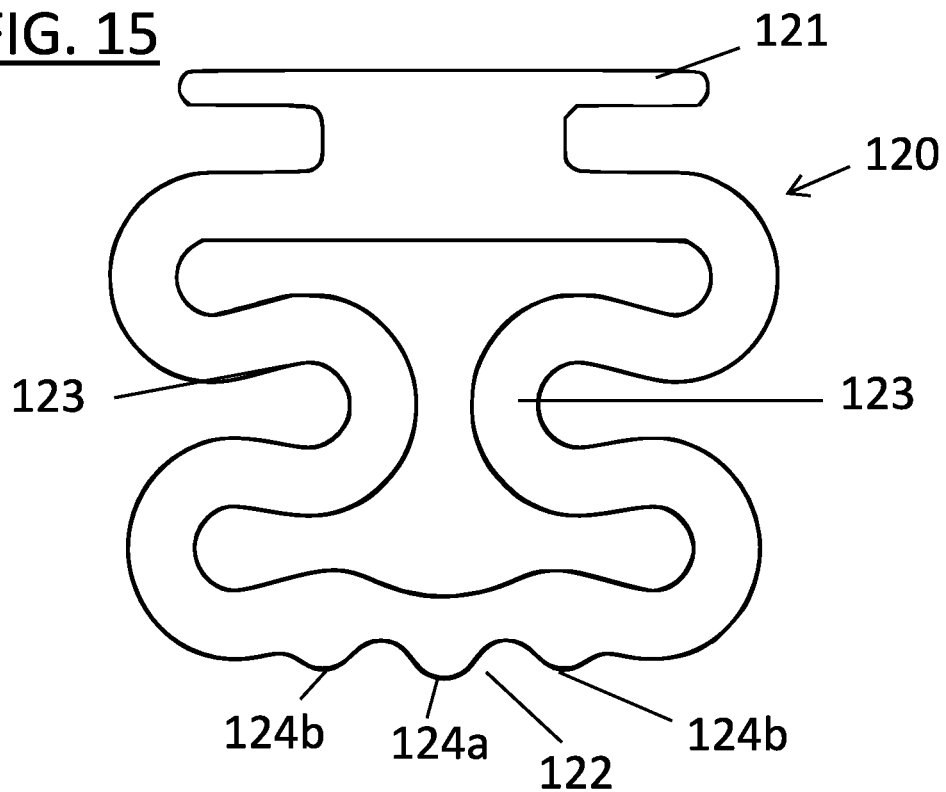
Figure 16:
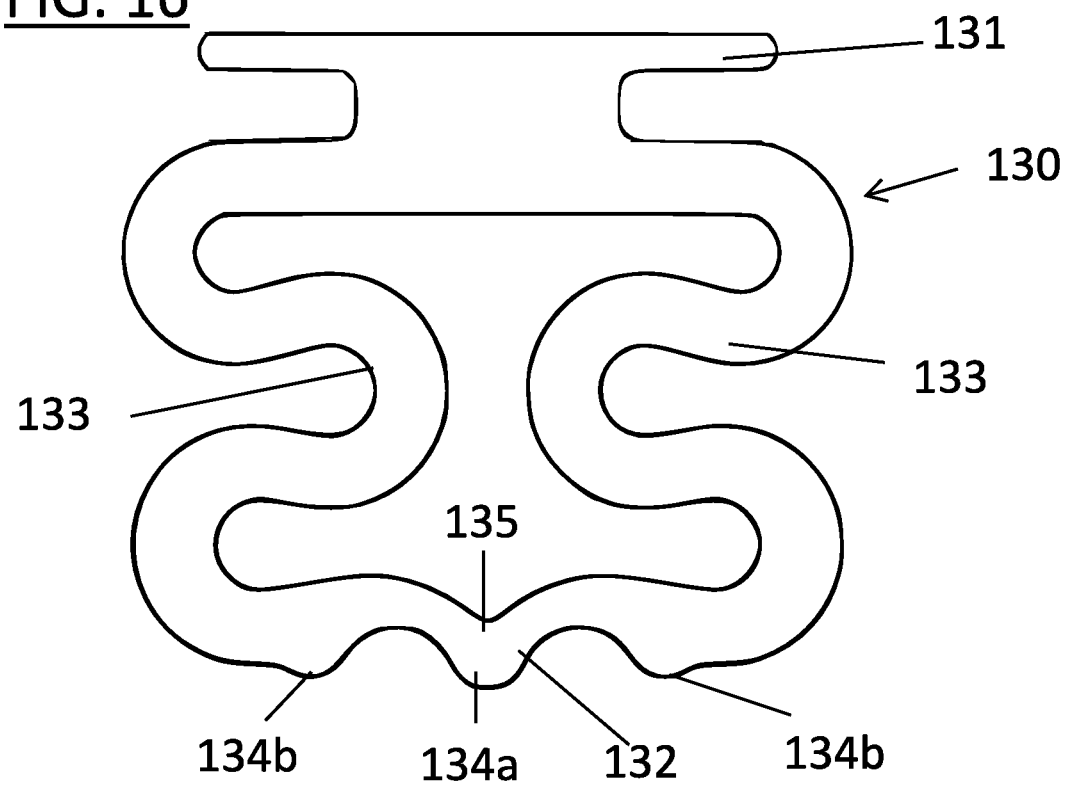

To counteract this effect, the embodiments shown in FIGS. 14 to 16 are designed to ensure that the central region of the engagement surface contacts the printing frame first during inflation.

FIG. 14 schematically shows a sectional view of an inflatable bladder 110, having an anchoring section 111 and engagement surface 112. It can be seen that the thickness of the bladder wall at the engagement surface 112 is relatively large, to reduce flexing in this region. In addition, the engagement surface 112 is profiled so as to include four flat-based projections, i.e. two inner projections 114a and an outer projection 114b on each lateral side of the inner projections 114a. The inner projections 114a are arranged to sit at a lower position in the uninflated state than the outer projections 114b, with this arrangement helping to ensure that the inner projections 114a contact the printing frame before the outer projections, during inflation of the bladder 110. An additional design feature is that a radius of curvature of a lower bellows section 115, being the outward radius closest to the engagement surface 112, is increased relative to a radius of curvature of an upper bellows section 116, being closest to the anchoring section 111. This modification acts to reduce strain in the bladder wall at the region of connection between the engagement surface 112 and the bellows 115.

FIG. 15 schematically shows a sectional view of an inflatable bladder 120, having an anchoring section 121 and engagement surface 122. The engagement surface 122 is modified with respect to the bladder 110 shown in FIG. 14, so that only three projections are provided, an inner projection 124a, and an outer projection 124b on each lateral side of the inner projection 124a. The inner projection 124a is arranged to sit at a lower position in the uninflated state than the outer projections 124b. The thickness of the bladder wall section at engagement surface 122 is not constant, and is slightly thinner in proximate inner projection 1254a than proximate outer projections 124b to increase flexibility and thus reduce local strain in the bellows 133 proximate the engagement surface. Each projection 124a, 124b is, in this embodiment, of rounded profile. This feature acts to improve release of the bladder 120 from the printing frame following clamping, and also ensures uniform contact between the engagement surface 122 and the printing frame at all extensions of the bladder 120. Additionally, all radiuses of curvature present within bellows 123 are made equal, to reduce overall strain within the bladder 120.

FIG. 16 schematically shows a sectional view of an inflatable bladder 130, having an anchoring section 131, engagement surface 132 and bellows 133. This embodiment is similar to that shown in FIG. 15, however the bladder wall at engagement surface 132 is profiled to include a V-shaped recess 135 on the wall opposite an inner projection 134a. The wall thickness proximate outer projections 134b is relatively large.

Whichever form of inflatable bladder is used, it is important that the engagement surface does not stick to the printing frame following clamping, to enable the printing frame to be easily removed and prevent damage to the bladder. There are various ways in which this may be achieved. For example, it is possible to chemically treat the bladder to reduce stiction, with a general aim to replace Hydrogen atoms at the engagement surface with alternative atoms. Possible chemical treatments include:

i) Bromination, for example by submerging the bladder in an approximately 5% solution of Bromine in water for around 3 minutes, and followed by neutralisation with an approximately 5% solution of Ammonia;

ii) Fluorination, for example using a process such as "Fluoro-seal" by Bettix Ltd;

iii) Chlorination, for example processing with Hypochlorite similarly to the Bromination process described above, or using bleaching powder and oxalic acid or hypochlorous acid.

Other suitable forms of chemical treatment are possible, as will be apparent to those skilled in the art.

As an alternative to using a chemical treatment, a physical layer of adhesion-reducing material may be applied or attached to the engagement surface to prevent sticking. Examples of such physical layer materials include:

i) Anti-static fabrics, which may be woven from metal-plated fibres and bonded to the engagement surface during moulding;

ii) Anti-static film, such as FEP film which again may be bonded to the engagement surface during moulding;

iii) A layer of non-stick coating, for example chalk, graphite or PTFE, applied to the engagement surface.

Other suitable forms of physical layering are possible, as will be apparent to those skilled in the art.

The above-described embodiments are exemplary only, and other possibilities and alternatives within the scope of the invention will be apparent to those skilled in the art. For example, while in the above-described embodiments the anchoring section is shown as male and the engagement section as female, these arrangements could be reversed, so that the clamping bracket includes a male section which engages with a female section located at the upper surface of the inflatable bladder or an insert. Furthermore, it is to be understood that the terms "anchoring section" and "engagement section" may be used interchangeably, to mean two sections which are profiled to enable inter-engagement therebetween.

Other types of mutually cooperative sections may be used to effect inter-engagement of the clamping bracket, inflatable bladder or bladders and insert or inserts as required. For example, such cooperation may be effected through the use of complementary areas of hook and loop fastening adhered to surfaces to be engaged in use. As an alternative, a magnetic coupling may be utilised. In this case, paramagnetic or ferromagnetic material may be adhered to or embedded within the surfaces.

REFERENCE NUMERALS 1, 31—Clamping system
2, 32—Chase
3—Receptacle
4a, 4b—Clamping rails
5—Printing screen
6, 93, 94—Printing frame
7a, 7b—Lateral chase beams
8—Connecting chase beam 9—Lugs
10—Chase actuators
11—Front rail support
12a, 12b—L-shaped supports
13a, 13b—Supporting ledges
14a, 14b—Walls
15a, 15b—Drive rods
16—Guides
17a, 17b—Drive rod actuators
18—Clamping fingers
19—Links
20—Locking system
33—Receptacle
34a, 34b—Clamping rails
35—Frame positioning member
36a, 36b, 90—Clamping bracket
37a, 37b—Lateral chase beams
38—Connecting chase beam
39—Lugs
40—Chase actuators
41—Front rail support
42a, 42b—L-shaped supports
43a, 43b—Supporting ledges
44a, 44b—Walls
45—Cover plate
46, 60, 68, 72, 100, 110, 120, 130—Inflatable bladder
47—Base
48a, 48b—Sidewalls
49—Engagement section
50—Locking system
51, 61, 65, 69, 71, 101, 111, 121, 131—Anchoring section
52, 76, 77—Fluid inlet/outlet port
53, 63, 103, 123, 133—Bellows
54, 62, 66, 70, 102, 112, 122, 132—Engagement surface
55—Frame upper surface
56—Inflatable bladder end wall
64, 67—Insert
73—First chamber
74—Second chamber
75—Diaphragm
80a, 80b—Supporting ledges
81a, 81b—Clamping brackets
82a, 82b—Bases
83a, 83b, 84a, 84b—Sidewalls
85a-d—Sidewall ends
86a, 86b, 91a, 91b—Inflatable bladders
87a, 87b—Engagement surfaces
88—Lateral support
92—Internal partition
114a, 124a, 134a—Inner projections
114b, 124b, 134b—Outer projections
115—Lower bellows section
116—Upper bellows section
135—V-shaped recess
X—Printing axis
Y—Lateral axis
Z—Vertical axis
C, Ca, Cb—clamping direction

The invention claimed is:

1. A clamping system which forms part of a screen-printing machine and is operative to clamp a printing screen frame within the screen-printing machine during a printing process, comprising:

a receptacle for receiving a frame in use, the receptacle at least partially defining a space for accommodating the frame, and the receptacle including a frame support for supporting the frame in use,
a clamping bracket,
an inflatable bladder retained by the clamping bracket, the inflatable bladder bearing an engagement surface, and
a fluid supply for supplying fluid to the inflatable bladder to inflate it from an uninflated state to an inflated state, wherein during inflation of the inflatable bladder the engagement surface is caused to move towards the space so that in use, while the inflatable bladder is in the uninflated state a printing frame may be loaded into the receptacle such that it rests on the frame support, and while the inflatable bladder is in the inflated state the printing frame is clamped by the inflatable bladder to be stationary relative to the frame support,
wherein the clamping bracket comprises a channel of substantially inverted U-shaped cross-section, having a base and two opposing sidewalls, the inflatable bladder being attachable to the base of the channel with the respective engagement surfaces arranged directly above and parallel with the frame support, and laterally restrained by the sidewalls of the channel during inflation, and
wherein the frame support is operative to support the printing frame in a horizontal plane in use, and the bladder is disposed above the horizontal plane so that the engagement surface moves downwards towards the space during inflation, so as to clamp the printing frame between the engagement surface and the frame support, and the clamping system comprises a second inflatable bladder, retained by a second clamping bracket, disposed above the horizontal plane, the first and second inflatable bladders being located on opposing sides of the space.

2. The clamping system of claim 1, wherein the first and the second clamping brackets are elongate, and the receptacle which at least partially defines the space comprises clamping rails which respectively carry the first and second clamping brackets, the first and the second clamping brackets extending along a portion of the respective clamping rail, and wherein the first and the second inflatable bladders and their respective engagement surfaces are elongate, such that each engagement surface extends along a side of the space.

3. The clamping system of claim 1, wherein the first and the second inflatable bladders and the first and the second clamping brackets comprise mutually cooperative sections such that each of the first and the second inflatable bladders is retained by the respective clamping bracket during cooperation of the mutually cooperative sections.

4. The clamping system of claim 3, further comprising a clamping insert having a first mutually cooperative section for cooperation with the mutually cooperative section of the first or the second inflatable bladder, and a second mutually cooperative section for cooperation with the mutually cooperative section of the first or the second clamping bracket, such that the first or the second inflatable bladder is retained by the clamping insert, which is in turn retained by the first or the second clamping bracket, during cooperation of the mutually cooperative sections.

5. The clamping system of claim 3, wherein the first and the second inflatable bladders each comprises a second mutually cooperative section, and the clamping system further comprises a clamping insert comprising:

a mutually cooperative section for cooperation with a mutually cooperative section of the first or the second inflatable bladder, such that the clamping insert is retained by the first or the second inflatable bladder during cooperation of the mutually cooperative sections; and the engagement surface.

6. The clamping system of claim 3, wherein the mutually cooperative sections are profiled to enable inter-engagement therebetween.

7. The clamping system of claim 1, wherein the first and the second inflatable bladders comprise the engagement surface.

8. The clamping system of claim 1, further comprising at least one additional inflatable bladder retained by the first or the second clamping bracket.

9. The clamping system of claim 1, further comprising a chemical treatment of the engagement surface to reduce stiction.

10. The clamping system of claim 1, further comprising a layer of adhesion-reducing material attached to the engagement surface.

11. A screen-printing machine comprising the clamping system of claim 1.

12. A method of clamping a printing screen frame within a screen-printing machine, the screen-printing machine comprising a clamping system including a receptacle for receiving the printing screen frame, the receptacle at least partially defining a space for accommodating the frame, the method comprising the steps of:

i) inserting a printing screen frame within the space such that it rests on a frame support in a horizontal plane; and ii) inflating first and second inflatable bladders retained by respective clamping brackets of the clamping system and disposed above the horizontal plane on opposing sides of the space, such that engagement surfaces borne by the first and the second inflatable bladders are caused to move away from the clamping bracket and downwards towards the space and the printing screen frame and thereby clamp the printing screen frame to the clamping system between the engagement surfaces and the frame support, wherein each of the clamping brackets comprises a channel of substantially U-shaped cross-section, having a base and two opposing sidewalls, the respective inflatable bladder being attachable to the base of the channel, and laterally restrained by the sidewalls of the channel during inflation.

13. The method of claim 12, comprising an initial step of selecting an inflatable bladder from a plurality of inflatable bladders, each inflatable bladder of said plurality having a different dimension when inflated, and engaging the selected inflatable bladder with the respective clamping bracket.

14. The method of claim 12, comprising an initial step of engaging a clamping insert with the first or the second inflatable bladder so as to adjust the position of the respective engagement surface relative to the respective clamping bracket before the respective inflatable bracket is inflated.

\* \* \* \* \*